(12) United States Patent
Wilson et al.

(10) Patent No.: US 7,579,273 B2
(45) Date of Patent: Aug. 25, 2009

(54) METHOD OF MANUFACTURING A PHOTODIODE ARRAY WITH THROUGH-WAFER VIAS

(75) Inventors: Robin Wilson, Holywood (GB); Conor Brogan, Belfast (GB); Hugh J. Griffin, Newtownabbey (GB); Cormac MacNamara, Belfast (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 26 days.

(21) Appl. No.: 11/837,150

(22) Filed: Aug. 10, 2007

(65) Prior Publication Data

US 2008/0099870 A1 May 1, 2008

Related U.S. Application Data

(60) Provisional application No. 60/821,993, filed on Aug. 10, 2006.

(51) Int. Cl.
*H01L 21/44* (2006.01)
(52) U.S. Cl. .................... 438/668; 438/9; 438/700; 438/712; 257/E21.042; 257/E21.053; 257/E21.304; 257/E21.352; 257/E21.655; 257/E31.115
(58) Field of Classification Search .......... 438/9, 438/91, 141, 418, 429, 501, 505, 510, 680, 438/668, 692, 700, 712
See application file for complete search history.

(56) References Cited

U.S. PATENT DOCUMENTS

| | | | |
|---|---|---|---|
| 3,648,131 A | 3/1972 | Stuby | |
| 5,562,801 A * | 10/1996 | Nulty | 438/695 |
| 5,936,268 A | 8/1999 | Cockrum et al. | |
| 5,998,292 A | 12/1999 | Black et al. | |
| 6,087,719 A | 7/2000 | Tsunashima | |
| 6,426,991 B1 | 7/2002 | Mattson et al. | |
| 6,720,595 B2 | 4/2004 | Clevenger et al. | |
| 6,762,473 B1 | 7/2004 | Goushcha et al. | |
| 6,831,367 B2 * | 12/2004 | Sekine | 257/774 |
| 7,057,254 B2 * | 6/2006 | Bui et al. | 257/443 |
| 2002/0020846 A1 | 2/2002 | Pi et al. | |
| 2004/0222482 A1 | 11/2004 | Bui et al. | |
| 2006/0027934 A1 | 2/2006 | Edelstein et al. | |

FOREIGN PATENT DOCUMENTS

| | | |
|---|---|---|
| WO | 2005001941 A2 | 1/2005 |
| WO | 2005031880 A1 | 4/2005 |

* cited by examiner

*Primary Examiner*—David Nhu
(74) *Attorney, Agent, or Firm*—Panitch Schwarze Belisario & Nadel LLP

(57) ABSTRACT

A method for manufacturing a photodiode array includes providing a semiconductor substrate having first and second main surfaces opposite to each other. The semiconductor substrate has a first layer of a first conductivity proximate the first main surface and a second layer of a second conductivity proximate the second main surface. A via is formed in the substrate which extends to a first depth position relative to the first main surface. The via has a first aspect ratio. Generally simultaneously with forming the via, an isolation trench is formed in the substrate spaced apart from the via which extends to a second depth position relative to the first main surface. The isolation trench has a second aspect ratio different from the first aspect ratio.

21 Claims, 3 Drawing Sheets

METHOD OF MANUFACTURING A PHOTODIODE ARRAY WITH THROUGH-WAFER VIAS

CROSS-REFERENCE TO RELATED APPLICATIONS

This application claims priority to U.S. Provisional Patent Application No. 60/821,993, filed Aug. 10, 2006, entitled "Method of Manufacturing a Photodiode Array with Through-Wafer Vias."

BACKGROUND OF THE INVENTION

Embodiments of the present invention relate to a photodiode array, and more particularly, to a method of manufacturing a photodiode array having through-wafer vias.

A photon detector or photodetector (also referred to as a photodiode) is a semiconductor device that converts radiant power (e.g., light) directly into electrical current. Positive-intrinsic-negative (PIN) diodes or PIN photodiodes and negative-intrinsic-positive (NIP) diodes or NIP photodiodes are generally known in the art. A PIN/NIP diode is a form of photodetector. A PIN diode is a type of photodiode with a large, mutually doped intrinsic region sandwiched between p-doped and n-doped semiconductor regions. The PIN diode name comes from the layering of the materials, positive, intrinsic, negative (i.e., PIN). A PIN diode typically exhibits an increase in its electrical conductivity as a function of the intensity, wave length and modulation rate of the incident radiation.

A PIN diode is also a semiconductor device that operates as a variable resistor at radiofrequency (RF) and microwave frequencies. The resistance value of a PIN diode is determined only by the forward bias direct current (DC) current. At high RF frequencies when a PIN diode is at zero or reversed bias, it appears as a parallel plate capacitor, essentially independent of reverse voltage.

Photoconductor or photodiode arrays are groups of a plurality of photodetectors or photodiodes, such as PIN/NIP diodes, that are arranged together on a substrate or a wafer. When many photodiodes are arranged on a substrate, it is desirable to provide back side contacts in order to maximize the surface area of the photo receptive portion of the photodiode on the front surface. Accordingly, it is desirable to provide through-wafer vias to couple an anode/cathode of the photodiode through to the back side of the photodiode array for making contacts. It is further desirable to provide a method of manufacturing a photodiode array with through-wafer vias.

BRIEF SUMMARY OF THE INVENTION

Briefly stated, an embodiment of the present invention comprises a method of manufacturing a photodiode array that includes providing a semiconductor substrate having first and second main surfaces opposite to each other. The semiconductor substrate has a first layer of a first conductivity proximate the first main surface and a second layer of a second conductivity proximate the second main surface. A via is formed in the substrate and extends to a first depth position relative to the first main surface. The via has a first aspect ratio. Generally simultaneously with forming the via, an isolation trench is formed in the substrate spaced apart from the via. The isolation trench extends to a second depth position relative to the first main surface. The isolation trench has a second aspect ratio different from the first aspect ratio.

Another embodiment of the present invention comprises a method for manufacturing a photodiode array that includes providing a semiconductor substrate having first and second main surfaces opposite to each other. The semiconductor substrate has a first layer of a first conductivity proximate the first main surface and a second layer of a second conductivity proximate the second main surface. For each diode in the array, a via is formed in the substrate and extends to a first depth position relative to the first main surface. The via has a first feature size. Generally simultaneously with forming the via, for each diode in the array an isolation trench is formed in the substrate spaced apart from the via. The isolation trench extends to a second depth position relative to the first main surface. The isolation trench has a second feature size different from the first feature size.

BRIEF DESCRIPTION OF THE SEVERAL VIEWS OF THE DRAWINGS

The foregoing summary, as well as the following detailed description of a preferred embodiment of the invention, will be better understood when read in conjunction with the appended drawings. For the purpose of illustrating the invention, there is shown in the drawings an embodiment which is presently preferred. It should be understood, however, that the invention is not limited to the precise arrangements and instrumentalities shown. In the drawings.

DETAILED DESCRIPTION OF THE INVENTION

Figure 1:
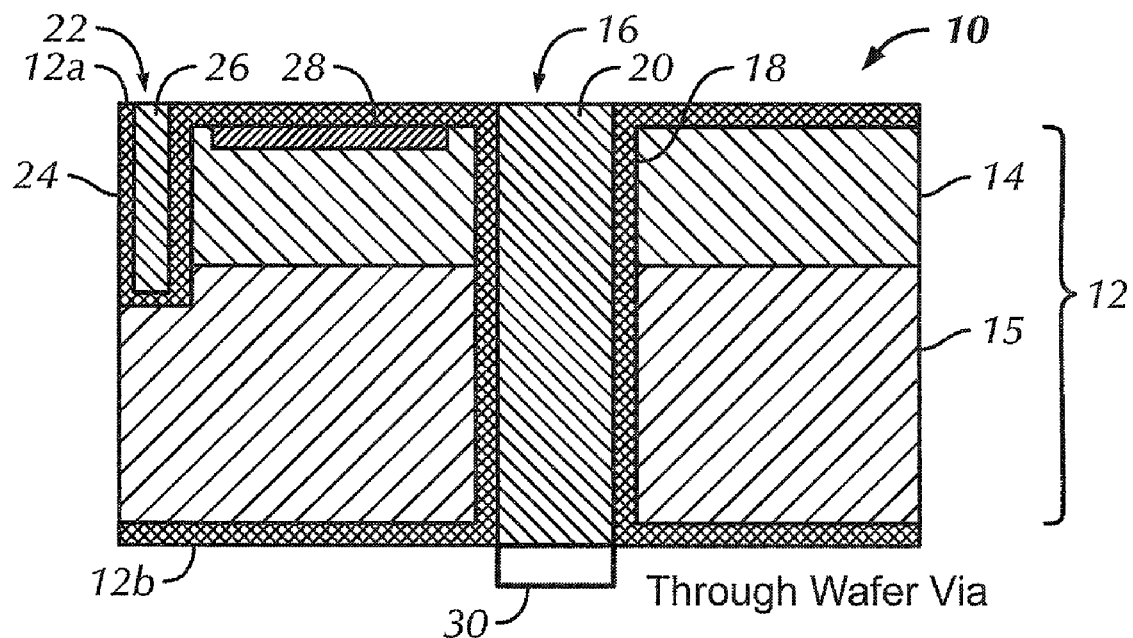
FIG. 1 is a partial cross-sectional elevational view of a photodiode array having a through-wafer via manufactured in accordance with a preferred embodiment of the present invention.
Figure 2:
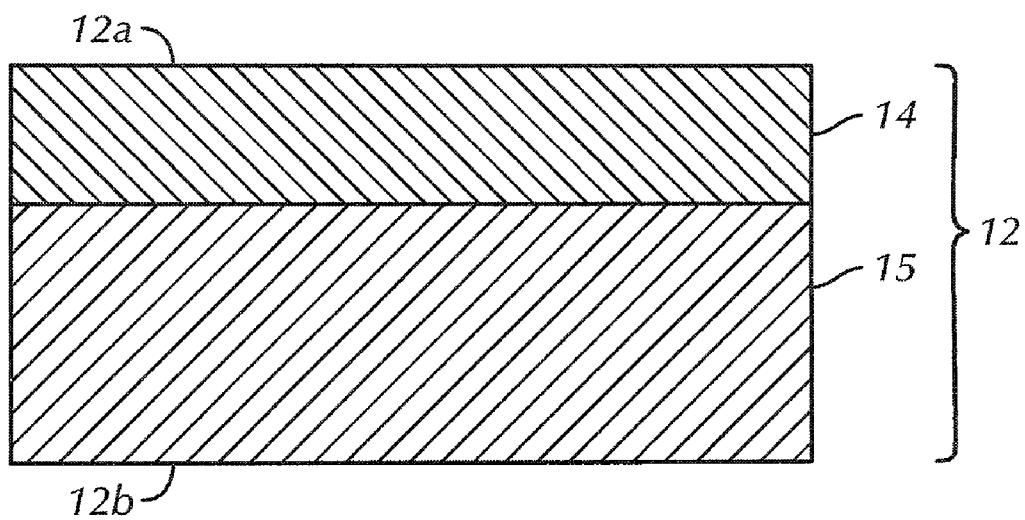
FIG. 2 is a partial cross-sectional elevational view of a semiconductor substrate for forming the photodiode array of FIG. 1.
Figure 3:
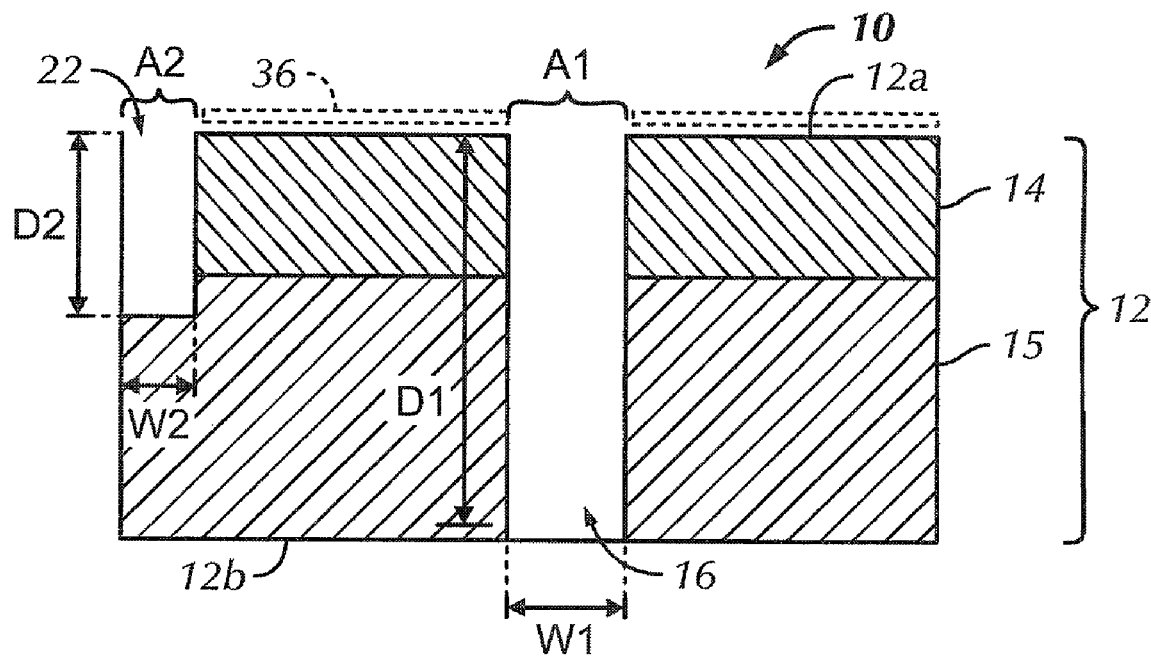
FIG. 3 is a partial cross-sectional elevational view of a partially formed photodiode array showing via and isolation trenching in accordance with a preferred embodiment of the present invention.

Certain terminology is used in the following description for convenience only and is not limiting. The words "right," "left," "lower," and "upper" designate directions in the drawings to which reference is made. The words "inwardly" and "outwardly" refer to direction toward and away from, respectively, the geometric center of the object described and designated parts thereof. The terminology includes the words above specifically mentioned, derivatives thereof and words of similar import. Additionally, the words "a" and "an," as used in the claims and in the corresponding portion of the specification, means "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Referring to the drawings in detail, wherein like numeral references indicate like elements throughout, there is shown in FIG. 1 a photodiode array 10 in accordance with a preferred embodiment of the present invention. The photodiode array 10 is formed of a substrate 12 having a first main surface 12a and an opposite second main surface 12b. The semiconductor substrate 12 has a first layer 14 of a first conductivity (e.g., $n^-$) proximate the first main surface 12a and a second layer 15 of a second conductivity (e.g., $n^+$) proximate the second main surface 12b. The photodiode array 10 includes a through-wafer via 16 extending from the first main surface 12a to the second main surface 12b filled with a conductive material 20 such as doped or undoped polysilicon (poly). The through-wafer via 16 is surrounded by a dielectric material 18 such as an oxide or silicon dioxide ($SiO_2$). The photodiode array 10 includes a plurality of photodiodes, but only a portion of one photodiode is depicted in FIG. 1 for simplicity. The photodiode array 10 further comprises an isolation trench 22 that surrounds a given photodiode. An isolation trench 22 extending through the first layer 14 and at least partially into the second layer 15 is also filled with a conductive material 26 such as doped or undoped polysilicon, or a semi-insulative material such as polycrystalline silicon (SIPOS) or the like. The isolation trench may also be filled with the dielectric material such as $SiO_2$ or silicon nitride ($Si_xN_y$) or the like. The isolation trench is also lined with the dielectric material 24 such as an oxide like $SiO_2$. The first main surface 12a and the second main surface 12b may also be coated with a dielectric material 18, 24 such as an oxide. An anode/cathode region 28 is formed on the first main surface 12a. A backside contact 30 is formed on the second main surface 12b at the via 16.

The semiconductor substrate 12 may be formed by alternate means known in the art. For example, the second layer 15 of the semiconductor substrate 12 may be a silicon crystal and the first layer 14 of the semiconductor substrate 12 can be formed by growing or depositing an epitaxial layer ("an epi layer") onto the second layer 15. Alternately, the first layer 14 of the semiconductor substrate 12 may be a silicon crystal and the second layer 15 of the semiconductor substrate 12 may also be a silicon crystal and the semiconductor substrate 12 can be formed by bonding or annealing the first layer 14 to the second layer 15 to form the semiconductor substrate 12. Alternately, the first and second layers 14, 15 of the semiconductor substrate 12 can be formed by doping using a dopant such as Boron or Phosphorous and diffusing the dopant into one surface of a silicon crystal by, for example, ion implantation, deposition and heating, or the like. While shown in the figures as a lightly doped ($n^-$) first layer 14 and a heavily doped ($n^+$) layer 15, the first layer 14 and the second layer 15 may be n or p type and may have other relative doping strengths.

Preferably, the semiconductor substrate 12 is formed of silicon (Si). But, the semiconductor substrate 12 may be formed of other materials such as gallium arsenide (GaAs), germanium (Ge), or the like.

Generally if a semiconductor crystal contains no impurities, the only charge carriers present are those produced by thermal breakdown of the covalent bonds and the conducting properties are characteristic of the pure semiconductor material. Such a crystal is termed an "intrinsic" semiconductor. When used with reference to a PIN or NIP diode, conventional usage in the art includes lightly doped intrinsic areas. While used herein to refer to the semiconductor substrate or substrate/epitaxial layer (as "intrinsic"), embodiments of the present invention recognize that the photodiode array 10 in accordance with embodiments of the present invention will work comparably with undoped substrates even when the semiconductor substrate has been lightly doped or even more heavily doped. Accordingly, the term "intrinsic" should not be construed as limiting and embodiments of the present invention can embrace pure and doped semiconductor substrates formed of various materials.

FIGS. 2-5 depict one possible method of manufacturing the photodiode array 10 in accordance with the preferred embodiment of the present invention. The method includes providing a semiconductor substrate 12 having first and second main surfaces 12a, 12b opposite to each other. The semiconductor substrate 12 has a first layer 14 of the first conductivity proximate the first main surface 12a and a second layer 15 of the second conductivity proximate the second main surface 12b. A first photo mask 36 (phantom in FIG. 3) is formed over at least a portion of the first main surface 12a of the substrate 12. The first photo mask 36 is formed using any known photolithography or similar masking technique. Portions of the photo mask 36 are removed for forming the via 16 and the isolation trench 22. A via 16 is formed in the substrate 12 extending completely through the substrate 12 to a first depth position D1 (FIG. 3) relative to the first main surface 12a. The via 16 has a first width W1 and a first aspect ratio A1. Generally simultaneously with forming the via 16, the isolation trench 22 is formed in the substrate 12 spaced apart from the via 16 extending through the first layer 14 and into the second layer 15 to a second depth position D2 relative to the first main surface 12a. The isolation trench 22 has a second width W2 and a second aspect ratio A2. The second aspect ratio A2 is different than the first aspect ratio A1. After forming the trench for the through-wafer via 16 and the trench for the isolation trench 22, the first photo mask 36 is removed from the first main surface 12a of the substrate 12. Preferably, the isolation trench 22 and the via 16 are formed by reactive ion etching (RIE). The isolation trench 22 and the via 16 may also be formed by other methods such as a wet chemical etch, a dry chemical etch, a plasma etch, sputter etching, vapor phase etching, or the like. Prior to or after forming the isolation trench 22 and the via 16, the first main surface 12a may be planarized, polished and/or ground using a process such as chemical mechanical polishing (CMP) or other techniques known in the art.

The surfaces 12a, 12b of the semiconductor substrate 12 may be smoothed, if needed, using one or more of the following processing steps:

(i) an isotropic plasma etch may be used to remove a thin layer of silicon (typically 100-1000 Angstroms (Å)) from the trench surfaces;

(ii) a sacrificial silicon dioxide layer may be grown on the surfaces of the trench and then removed using an etch such as buffered oxide etch or diluted hydrofluoric (HF) acid etch.

The use of either or both of these techniques can produce smooth trench surfaces with rounded corners whole removing residual stress and unwanted contaminates. However, where it is desirable to have vertical sidewalls and square corners, an anisotropic etch process will be used instead of the isotropic etch process discussed above. Anisotropic etching, in contrast to isotropic etching, generally means different etch rates in different directions in the material being etched.

Figure 4:
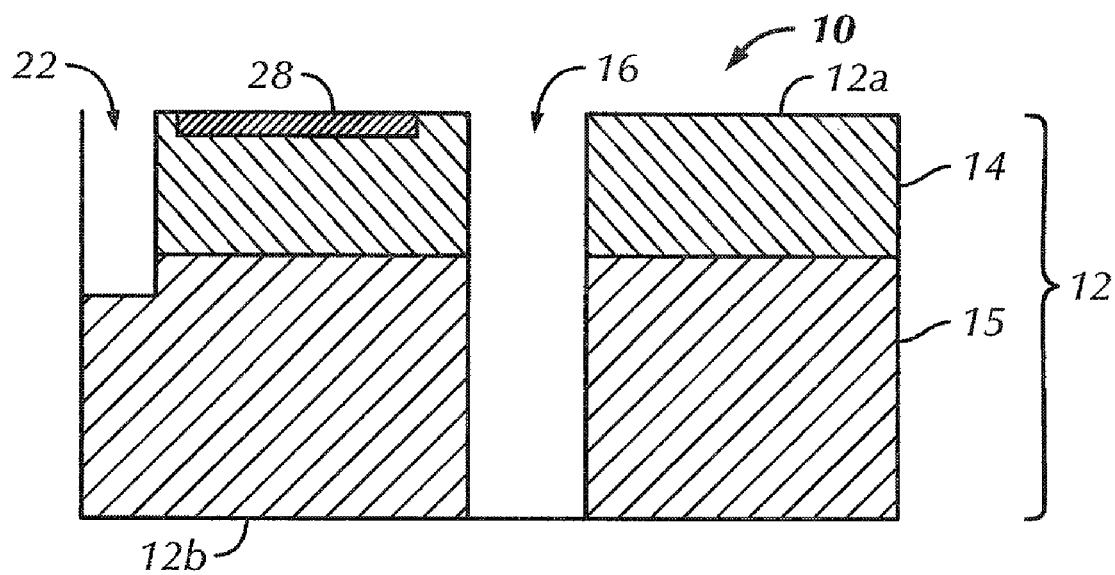
FIG. 4 is a partial cross-sectional elevational view of the partially formed photodiode array showing optional doping to form an anode/cathode region in accordance with a preferred embodiment of the present invention.

FIG. 4 shows that a portion of the first main surface 12a may be doped to form an anode/cathode region 28. The doping may be ion implantation using Boron or Phosphorous. The ion implantation may be at a high energy level in the range of about 40 kilo-electron-volts (KeV) to several mega-eV (MeV). Preferably, the energy level is in the range of about 200 KeV to 1 MeV, but it should be recognized that energy level should be selected to sufficiently implant the dopant. Following implanting the dopant, a drive in step or a diffusion is performed at a temperature of about 800° to 1200° C. for up to about 24 hours so that the dopant is sufficiently diffused into the portion of the first main surface 12a. Other doping methods as are known in the art may be utilized without departing from the present invention.

Figure 5:
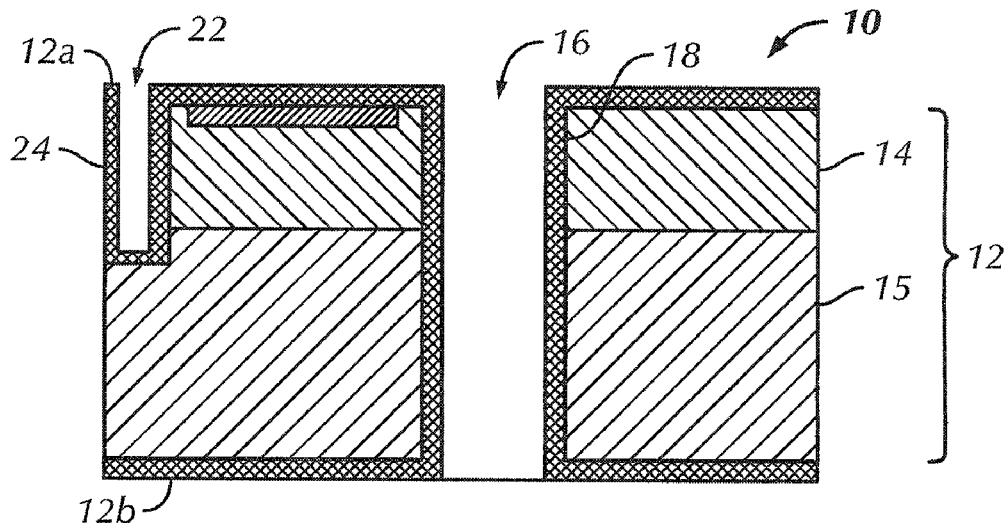
FIG. 5 is a partial cross-sectional elevational view of the partially formed photodiode array showing deposition of a dielectric lining material in accordance with a preferred embodiment of the present invention.

Referring to FIG. 5, the walls of the via 16 and the walls of the isolation trench 22 and portions of the first main surface 12a proximate to the via 16 and the trench 22 are then lined with a dielectric material 18, 24. The dielectric layers 18, 24 may be formed by low pressure (LP) chemical vapor deposition (CVD), tetraethylorthosilicate (TEOS), a spun-on-glass (SOG) deposition, or other techniques known in the art. The second main surface 12b may also be lined with a dielectric layer 18, 24. The dielectric material may include oxides, glass, or other dielectrics known in the art.

The via 16 and the isolation trench 22 are then filled with a conductive material 20, 26 as shown in FIG. 1. The conductor material 20, 26 may be the same or may be different. Preferably, the conductive material 20, 26 is doped or undoped poly or a metal. Preferably, the conductive material 20, 26 completely fills the via 16 and isolation trench 22 respectively. After refill, the partially formed photodiode array 10 can be planarized or polished using CMP or other techniques known in the art.

Backside contact 30, as shown in FIG. 1, may be formed by sputtering, evaporation, and/or electroplating. The contact 30 may be a metal such as aluminum (Al), aluminum silicon (Al[% Si]), copper (Cu), gold (Au), silver (Ag), titanium (Ti), tungsten (W), nickel (Ni), or the like and combinations thereof. The contact 30 may also be doped or undoped polysilicon or layers of differing metals as is known in the art.

Other processing steps, as are known in the art, may be utilized without departing from the invention.

Figure 6:
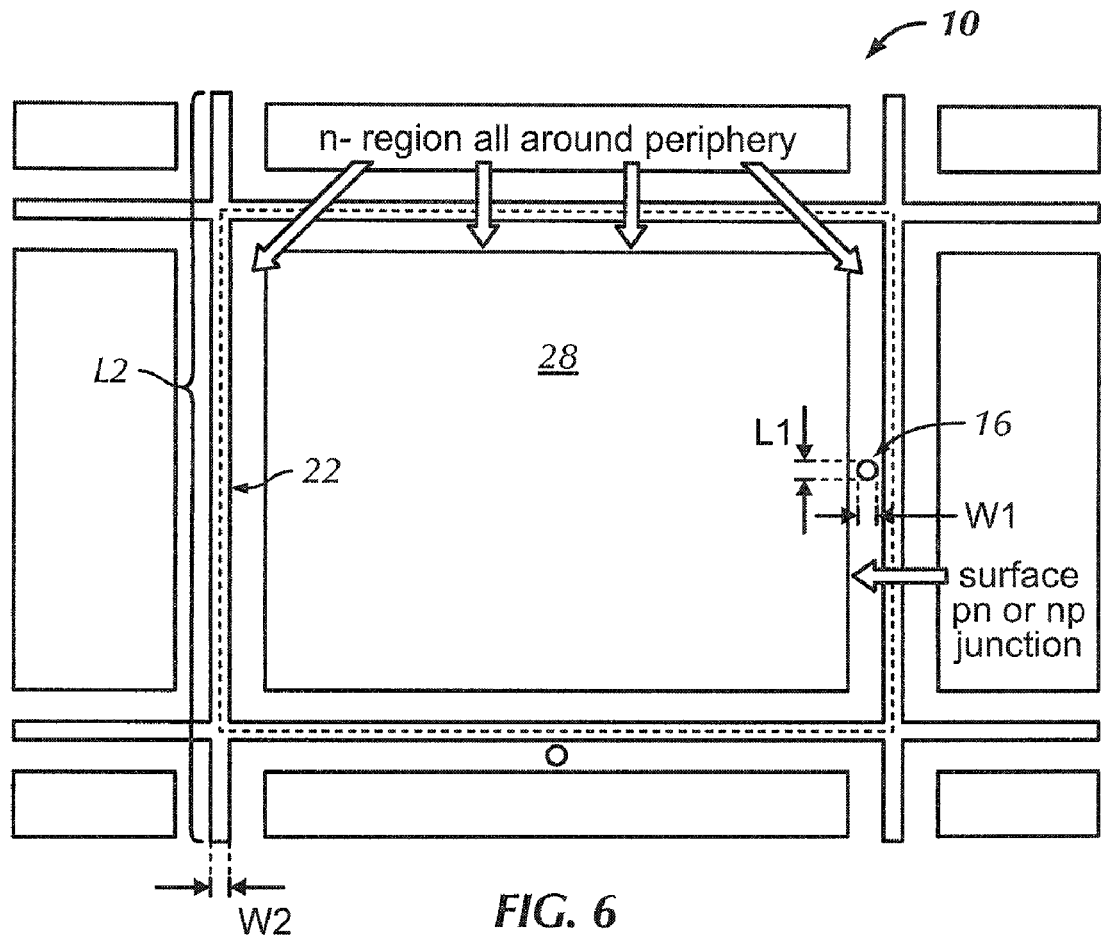
FIG. 6 is a partial top plan view of the photodiode array of FIG. 1.

FIG. 6 is a partial top plan view of the photodiode array 10. The dashed lines mark the periphery of one photodiode in the array 10. The first aspect ratio A1 is L1:W1 and the second aspect ration A2 is L2:W2. The first and second aspect ratios A1, A2 refer to the "feature size" of the feature being etched such as the via 16 and the isolation trench 22. Generally, wider features etch at a higher rate than narrower features. Varying the first dimension L1, L2 affects the etch rate and varying the second dimension W1, W2, affects the etch rate again. Thus, RIE etch lag is two-dimensionally important.

Where a feature is wider, more etchant can access the feature (via 16, trench 22), and therefore, the feature (via 16, trench 22) will etch faster or deeper per unit of time. The isolation trench 22 has a smaller feature size than the via 16. The first aspect ratio A1 is preferably lower than the second aspect ratio A2. The first aspect ratio A1 causes the via 16 to etch at a faster rate than the isolation trench 22 because of RIE lag by sufficiently adjusting process conditions. The different aspect ratios A1, A2 cause the via 16 and isolation trench 22 to etch at different rates. Lower aspect ratio features such as the larger via 16 can be made to etch faster than the higher aspect ratio features such as the isolation trench 22, and therefore, the etching process penetrates the substrate 12 to a greater depth D1 for the lower aspect ratio features. Accordingly, the first aspect ratio A1 and the second aspect ratio A2 at least partially determine the entry of the via 16 and the isolation trench 22, respectively. The first depth position D1 preferably extends to approximately the second main surface 12b of the semiconductor substrate 12. Optionally, the first depth position D1 may extend to just before the second main surface 12b of the semiconductor substrate 12, and back grinding or polishing can be utilized to expose the trench that forms the via 16. The second depth position D2 preferably extends through the first layer 14 of the semiconductor substrate 12 and only partially into the second layer 15 of the semiconductor substrate 12 or to a sufficient depth D2 to minimize cross talk between photodiodes of the photodiode array 10. Other factors that affect the etch rate include the etch time, reactor chamber pressure, plasma power, the density of the etch pattern and other etch chemistry/process parameters.

Optionally, sidewalls of the isolation trench 22 can be doped and/or diffused to prevent surface recombination. Accordingly, a sufficient gap needs to exist between the via 16 and the isolation trench when sidewall diffusion is necessary so as not to adversely effect the active diode area.

Additional vias may be formed in the substrate at any time in the process as desired. Any of the techniques described above for forming vias, for example, RIE, may be used to form the additional vias.

From the foregoing, it can be seen that embodiments of the present invention are directed to a method of manufacturing a photodiode array having through-wafer vias. It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for manufacturing a photodiode array comprising:
   providing a semiconductor substrate having first and second main surfaces opposite to each other, the semiconductor substrate having a first layer of a first conductivity proximate the first main surface and a second layer of a second conductivity proximate the second main surface;
   forming a via in the semiconductor substrate that extends to a first depth position relative to the first main surface, the via having a first aspect ratio; and
   generally simultaneously with forming the via, forming an isolation trench in the semiconductor substrate spaced apart from the via that extends to a second depth position relative to the first main surface, the isolation trench having a second aspect ratio different than the first aspect ratio.

2. The method for manufacturing a photodiode array according to claim 1, wherein the isolation trench and the via are formed by Reactive Ion Etching (RIE).

3. The method for manufacturing a photodiode array according to claim 2, wherein the first aspect ratio is lower than the second aspect ratio, the first aspect ratio causing the via to etch at a faster rate than the isolation trench.

4. The method for manufacturing a photodiode array according to claim 2, wherein the first aspect ratio and the second aspect ratio at least partially determine the etch rate of the via and the isolation trench, respectively.

5. The method for manufacturing a photodiode array according to claim 1, further comprising:

lining at least one of the walls of the via, at least one of the walls of the isolation trench and portions of the first main surface with a dielectric material.

6. The method for manufacturing a photodiode array according to claim 5, further comprising:
   filling at least a portion of the via and at least a portion of the isolation trench with one of doped and undoped polysilicon.

7. The method for manufacturing a photodiode array according to claim 6, further comprising:
   forming a backside contact on the second main surface at the via.

8. The method for manufacturing a photodiode array according to claim 1, wherein the first depth position extends to approximately the second main surface of the semiconductor substrate.

9. The method for manufacturing a photodiode array according to claim 1, wherein the second depth position extends through the first layer of the semiconductor substrate and partially into the second layer of the semiconductor substrate.

10. The method for manufacturing a photodiode array according to claim 1, further comprising:
    at least one of planarizing, polishing and grinding the first main surface, prior to forming the via and the isolation trench.

11. The method for manufacturing a photodiode array according to claim 1, further comprising:
    at least one of planarizing, polishing and grinding the first main surface, after forming the via and the isolation trench.

12. The method for manufacturing a photodiode array according to claim 1, wherein the first conductivity is lightly doped n-type and the second conductivity is heavily doped n-type.

13. The method for manufacturing a photodiode array according to claim 1, wherein the first conductivity is lightly doped p-type and the second conductivity is heavily doped p-type.

14. The method for manufacturing a photodiode array according to claim 1, wherein the via and the isolation trench are formed utilizing one of plasma etching, Reactive Ion Etching (RIE) and chemical etching.

15. The method for manufacturing a photodiode array according to claim 1, wherein the second layer of the semiconductor substrate is a silicon crystal and the first layer of the semiconductor substrate is formed by growing or depositing an epitaxial layer onto the second layer.

16. The method for manufacturing a photodiode array according to claim 1, wherein the first layer of the semiconductor substrate is a silicon crystal, the second layer of the semiconductor substrate is a silicon crystal and the semiconductor substrate is formed by bonding a first layer to the second layer.

17. The method for manufacturing a photodiode array according to claim 1, wherein the first and second layers of the semiconductor substrate are formed by doping using a dopant and diffusing the dopant into one surface of a silicon crystal.

18. The method for manufacturing a photodiode array according to claim 1, further comprising:
    filling at least a portion of the via and at least a portion of the isolation trench with one of doped and undoped polysilicon.

19. The method for manufacturing a photodiode array according to claim 1, further comprising:
    separately forming at least one additional via in the semiconductor substrate.

20. A method for manufacturing a photodiode array comprising:
    providing a semiconductor substrate having first and second main surfaces opposite to each other, the semiconductor substrate having a first layer of a first conductivity proximate the first main surface and a second layer of a second conductivity proximate the second main surface;
    for each photodiode in the photodiode array, forming a via in the semiconductor substrate that extends to a first depth position relative to the first main surface, the via having a first feature size; and
    generally simultaneously with forming the via, for each photodiode in the photodiode array, forming an isolation trench in the semiconductor substrate spaced apart from the via that extends to a second depth position relative to the first main surface, the isolation trench having a second feature size different than the first feature size.

21. A method for manufacturing a photodiode array comprising:
    providing a semiconductor substrate having first and second main surfaces opposite to each other, the semiconductor substrate having a first layer of a first conductivity proximate the first main surface and a second layer of a second conductivity proximate the second main surface;
    forming a via in the semiconductor substrate that extends to a first depth position relative to the first main surface, the via having a first aspect ratio; and
    forming the via and forming at least one isolation trench in the semiconductor substrate generally simultaneously, the at least one isolation trench being spaced apart from the via and extending to a second depth position relative to the first main surface, the isolation trench having a second aspect ratio different than the first aspect ratio.

* * * * *